United States Patent
Park et al.

(10) Patent No.: US 8,262,239 B2
(45) Date of Patent: Sep. 11, 2012

(54) DISPLAY FILTER HAVING A GREAT EM-RADIATION SHIELDING EFFECT AND DISPLAY APPARATUS INCLUDING THE SAME

(75) Inventors: Tae Soon Park, Suwon-si (KR); Sang Cheol Jung, Suwon-si (KR); In Sung Sohn, Suwon-si (KR)

(73) Assignee: Samsung Corning Precision Materials Co., Ltd., Gyeongsang buk-Do (KR)

( * ) Notice: Subject to any disclaimer, the term of this patent is extended or adjusted under 35 U.S.C. 154(b) by 0 days.

(21) Appl. No.: 12/905,648

(22) Filed: Oct. 15, 2010

(65) Prior Publication Data

US 2011/0032620 A1    Feb. 10, 2011

Related U.S. Application Data

(63) Continuation of application No. 11/715,438, filed on Mar. 8, 2007, now abandoned.

(30) Foreign Application Priority Data

Mar. 8, 2006  (KR) ........................ 10-2006-0021845

(51) Int. Cl.
    *G02B 27/00*   (2006.01)
(52) U.S. Cl. ......... 359/614; 348/820; 348/834; 348/842
(58) Field of Classification Search ........................ None
    See application file for complete search history.

(56) References Cited

U.S. PATENT DOCUMENTS

| | | | |
|---|---|---|---|
| 6,545,412 B1 | 4/2003 | Jang | |
| 6,657,387 B1 | 12/2003 | Yoo | |
| 7,456,557 B2 | 11/2008 | Park et al. | |
| 7,642,469 B2 * | 1/2010 | Arakawa et al. | 174/381 |
| 7,679,275 B2 | 3/2010 | Park et al. | |
| 7,690,819 B2 | 4/2010 | Seo | |
| 2002/0075203 A1 | 6/2002 | Woodruff et al. | |
| 2004/0239248 A1 | 12/2004 | Chang et al. | |
| 2005/0095449 A1 | 5/2005 | Yanagisawa et al. | |
| 2005/0253493 A1 | 11/2005 | Park et al. | |
| 2006/0019182 A1 | 1/2006 | Lee et al. | |
| 2006/0043895 A1 | 3/2006 | Choi | |
| 2006/0142412 A1 * | 6/2006 | Yamaoka et al. | 523/111 |

(Continued)

FOREIGN PATENT DOCUMENTS

CN    1414903    4/2003

(Continued)

OTHER PUBLICATIONS

European Search Report Issued in corresponding European Patent Application No. 07103136.3-2217, dated Jun. 6, 2007.

(Continued)

*Primary Examiner* — Arnel C Lavarias
(74) *Attorney, Agent, or Firm* — McDermott Will & Emery LLP

(57) ABSTRACT

A display filter and a display apparatus including the display filter increase a contrast ratio, increase brightness, and have a great electromagnetic (EM) radiation-shielding effect. The display filter includes a filter base and an external light-shielding layer formed on a surface of the filter base. The external light-shielding layer includes a base substrate including a transparent resin and light-shielding patterns spaced apart on a surface of the base substrate at predetermined intervals, and including a conductive material.

9 Claims, 3 Drawing Sheets

U.S. PATENT DOCUMENTS

| | | |
|---|---|---|
| 2006/0250064 A1 | 11/2006 | Park et al. |
| 2007/0257591 A1 | 11/2007 | Park et al. |
| 2008/0088215 A1 | 4/2008 | Park et al. |
| 2008/0137222 A1 | 6/2008 | Park et al. |

FOREIGN PATENT DOCUMENTS

| | | |
|---|---|---|
| CN | 1574164 | 2/2005 |
| JP | 2000-105311 | 4/2000 |
| JP | 2003-023290 | 1/2003 |
| JP | 2004-012918 | 1/2004 |
| KR | 10-2004-0043936 | 5/2004 |
| KR | 10-2004-0085765 | 10/2004 |
| WO | WO 01/47707 A1 | 7/2001 |
| WO | WO 2004016061 A1 * | 2/2004 |
| WO | WO 2004111152 A1 * | 12/2004 |

OTHER PUBLICATIONS

Chinese Office Action, with English Translation, issued in Chinese Patent Application No. CN 200710005649.2, dated Jun. 27, 2008.

* cited by examiner

DISPLAY FILTER HAVING A GREAT EM-RADIATION SHIELDING EFFECT AND DISPLAY APPARATUS INCLUDING THE SAME

CROSS-REFERENCE TO RELATED APPLICATION

This application is a Continuation of U.S. Ser. No. 11/715,438, filed on Mar. 8, 2007, now abandoned and claims the benefit of Korean Patent Application No. 10-2006-0021845, filed on Mar. 8, 2006, in the Korean Intellectual Property Office, the entire contents of each of which are incorporated herein by reference.

BACKGROUND OF THE INVENTION

1. Field of the Invention

The present invention relates to a display filter and a display apparatus including the display filter, and more particularly, to a display filter and a display apparatus including the display filter, which can increase a contrast ratio in a bright room, increase brightness, and have a great electromagnetic (EM) radiation-shielding effect.

2. Description of Related Art

In a conventional display filter, a method of excessively reducing a transmittance of the filter, and controlling reflection amount of external light in order to increase a contrast ratio in a bright room is used. Also, a multi-layered transparent conductive film stacking a conductive mesh film, a metal thin film, and a transparent thin film having a high refractive index, and the like may be used for an electromagnetic (EM) radiation-shielding layer in order to increase an EM radiation-shielding effect.

The multi-layered transparent conductive film is generally formed by stacking four to six metal thin films in order to increase the EM radiation-shielding effect. In general, the greater the number of the metal thin films stacked in the multi-layered transparent conductive film there are, the greater the EM radiation-shielding effect is. However, transmittance with regard to visible light is decreased, and therefore, brightness is reduced. Also, the greater the number of the metal thin films there are, the greater a period of time required for production is, and the higher a unit cost of manufacturing is.

Therefore, a display filter and a display apparatus including the display filter, which can increase a contrast ratio in a bright room, increase brightness, and have a great EM radiation-shielding effect, are required.

BRIEF SUMMARY

An aspect of the present invention provides a display filter, which can increase a contrast ratio, increase brightness, and have a great electromagnetic (EM) radiation-shielding effect.

An aspect of the present invention also provides a display apparatus including a display filter.

Technical solutions of the present invention are not limited to the above technical solutions, and other technical solutions which are not described would be definitely appreciated from a description below by those skilled in the art.

According to an aspect of the present invention, there is provided a display filter including: a filter base; and an external light-shielding layer formed on a surface of the filter base, wherein the external light-shielding layer includes a base substrate including a transparent resin and light-shielding patterns spaced apart on a surface of the base substrate at predetermined intervals, and including a conductive material.

According to another aspect of the present invention, there is provided a display apparatus including a display filter.

Details of other exemplary embodiments are included in brief description of the drawings.

Advantages and features of the present invention and methods of performing the advantages and features may be apparent with reference to appended drawings and following exemplary embodiments described in detail. However, the present invention is not limited to the exemplary embodiments disclosed below, and may be realized in various forms. The exemplary embodiments are provided to completely disclose the present invention and fully inform those skilled in the art of categories of the invention, and the present invention is defined by the categories of claims. Identical reference numerals refer to identical elements throughout a specification.

The display apparatus used for the present invention can be variously applied to large-size display apparatuses such as PDP apparatuses realizing RGB with lattice-patterned pixels, organic light emitting diode (OLED) apparatuses, liquid crystal display (LCD) apparatuses, field emission display (FED) apparatuses, and the like, small-size mobile display apparatuses such as personal digital assistants (PDAs), display windows of small game devices, display windows of cellular phones, and the like, flexible display apparatuses, and the like. In particular, the display apparatus of the present invention may be efficiently applied to display apparatuses for outdoor applications having a strong external light, and display apparatuses installed indoors of public facilities. The present invention is described by using the PDP apparatus and the PDP filter used for the PDP apparatus for convenience of description, but the present invention is not limited thereto and can be applied to the above various display apparatuses and the display filters used for the display apparatuses.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF EMBODIMENTS

Figure 1:
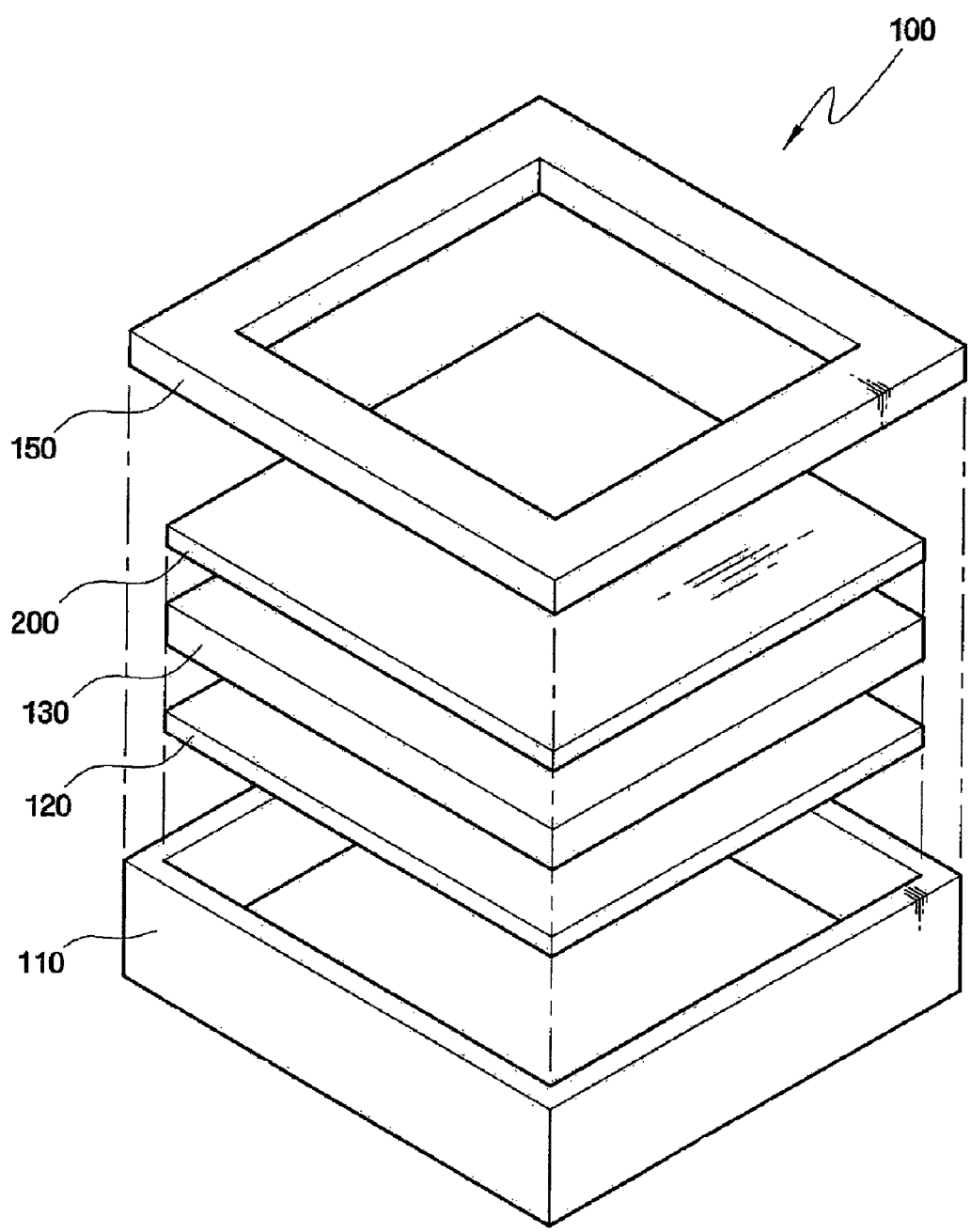
FIG. 1 is an exploded perspective view illustrating a plasma display panel (PDP) apparatus according to an exemplary embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

FIG. 1 is an exploded perspective view illustrating a plasma display panel (PDP) apparatus according to an exemplary embodiment of the present invention. A structure of the PDP apparatus 100 according to the exemplary embodiment of the present invention includes a case 110, a cover 150 covering an upper part of the case 110, a driving circuit board 120 received in the case 110, a panel assembly 130 including a discharge cell where a gas discharge phenomenon occurs, and a PDP filter 200, as illustrated in FIG. 1. The PDP filter 200 includes a conductive layer including a material with high conductivity on a transparent substrate, and the conductive layer is grounded to the case 110 via the cover 150. Specifically, electromagnetic (EM) radiation generated from the panel assembly 130 is shielded by the cover 150 and the case 110 which are grounded using the conductive layer of the PDP filter 200, before reaching a viewer.

Hereinafter, the PDP filter 200 shielding EM radiation, near infrared (NI) radiation, external light, and the like is first described, and the PDP apparatus 100 including the PDP filter 200 and the panel assembly 130 is then described.

Figure 2:
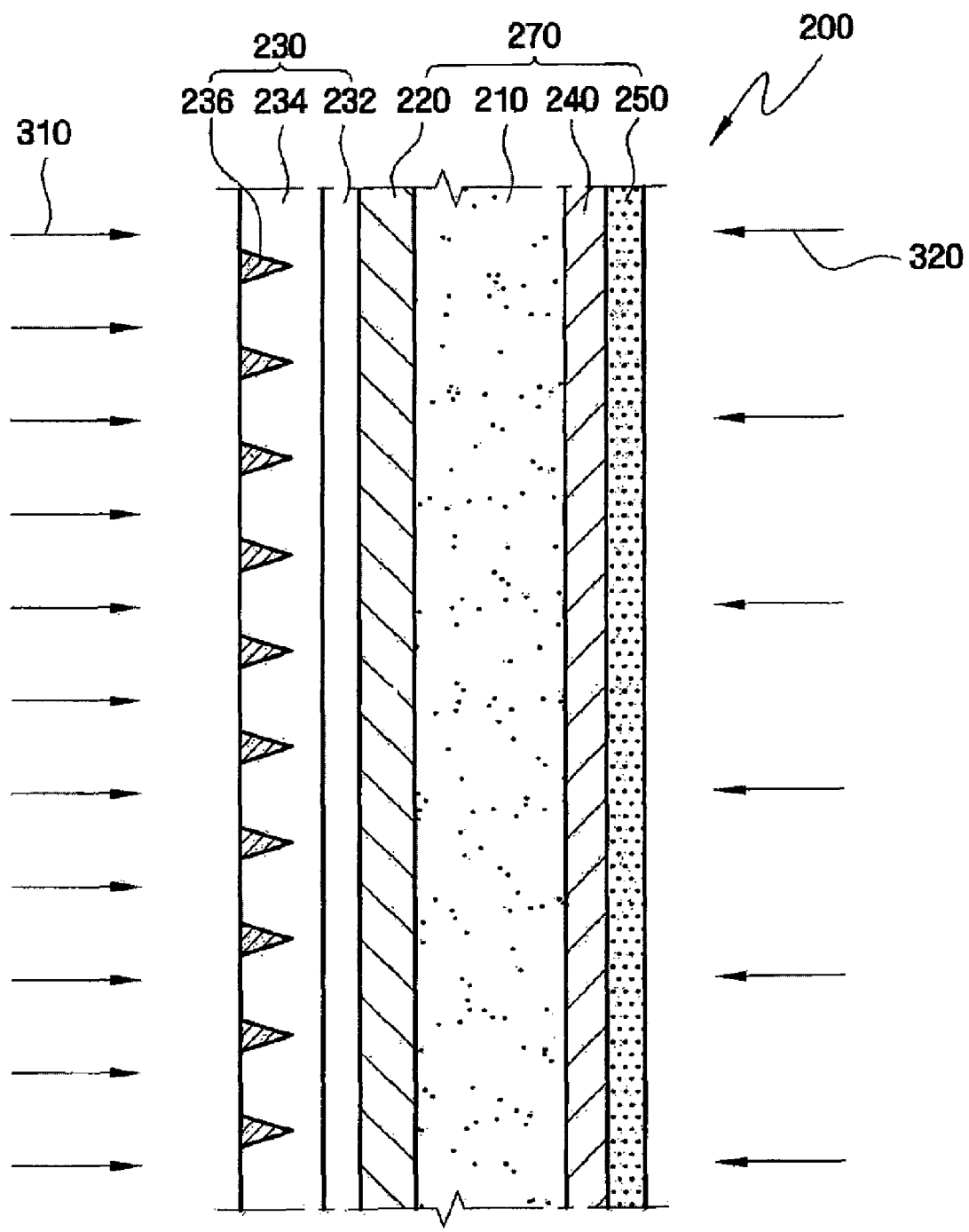
FIG. 2 is a sectional view illustrating a PDP filter according to an exemplary embodiment of the present invention.
Figure 3:
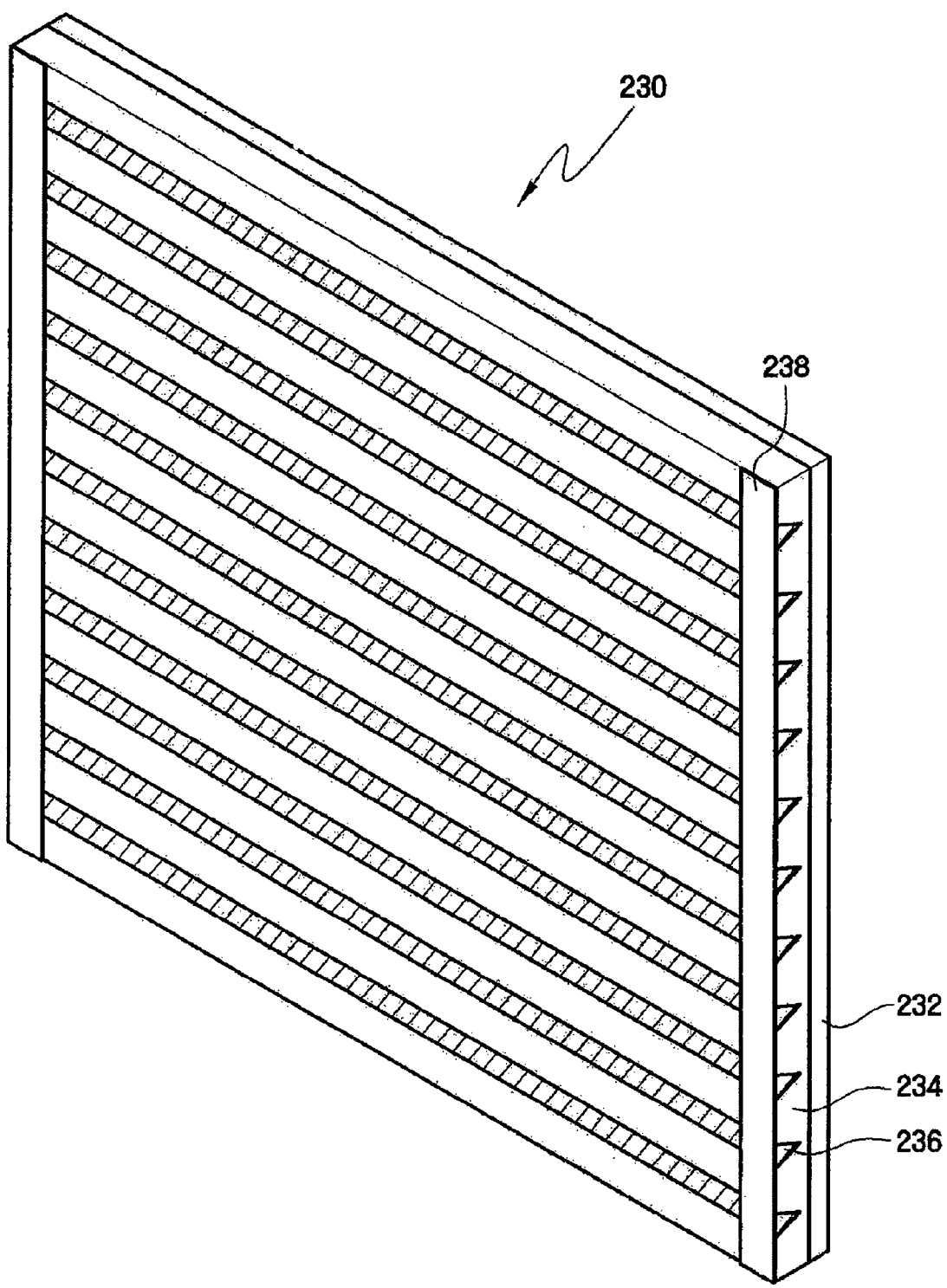
FIG. 3 is a perspective view illustrating the external light-shielding layer of the PDP filter in FIG. 2.

FIG. 2 is a sectional view illustrating a PDP filter according to an exemplary embodiment of the present invention, and FIG. 3 is a perspective view illustrating the external light-shielding layer of the PDP filter in FIG. 2.

As illustrated in FIG. 2, the PDP filter 200 according to the present exemplary embodiment includes a filter base 270 and a color correction layer 240. The filter base 270 includes a transparent substrate 210, and layers having various shielding functions, and the like, are disposed on the transparent substrate 210.

Here, the filter base 270 is formed by stacking the transparent substrate 210, an EM radiation-shielding layer 220, a color correction layer 240, or an antireflective layer 250 regardless of order. Hereinafter, layers corresponding to an EM radiation-shielding function, a color correction function, and an antireflection function are described as separate layers in the present exemplary embodiment, but the present invention is not limited thereto. Specifically, the filter base 270 according to the present exemplary embodiment may include at least one layer, and each layer may have at least one function from the group consisting of the EM radiation-shielding function, the color correction function, and the antireflection function. Also, the filter base 270 may either collectively have the EM radiation-shielding function, the color correction function, and the antireflection function, or have merely one function of the EM radiation-shielding function, the color correction function, and the antireflection function.

The external light-shielding layer 230 is disposed on a surface of the filter base 270. The external light-shielding layer 230 of the exemplary embodiment illustrated in FIG. 2 is disposed on a surface of the filter base 270, i.e. an opposite surface of a viewer position when the PDP filter 200 is installed in the PDP apparatus, but the present invention is not limited thereto, and the external light-shielding layer 230 may be disposed on another surface of the filter base 270.

Referring to FIGS. 2 and 3, the external light-shielding layer 230 includes a supporter 232, a base substrate 234 formed on a surface of the supporter 232, and a light-shielding pattern 236 formed in the base substrate 234. The light-shielding pattern 236 shields the panel assembly from external light 320 entering from an outer surface of the PDP filter. The light-shielding pattern 236 may be formed in either intaglio or relief in the base substrate 234, and have either a two-dimensional or a three-dimensional shape. For convenience of description, a wedge-shaped black stripe is described as an example of the light-shielding pattern 236 in the present exemplary embodiment, but the present invention is not limited thereto.

Here, the base substrate 234 where the light-shielding pattern 236 is formed may be directly formed in the filter base 270, but the base substrate 234 may be combined with the filter base 270 after forming the base substrate 234 on the supporter 232, as illustrated in FIG. 2. The supporter 232 supports the base substrate 234 where the light-shielding pattern 236 is formed. The base substrate 234 and the surface of the filter base 270 are combined via the supporter 232 in the exemplary embodiment illustrated in FIG. 2, but the present invention is not limited thereto. Specifically, since the supporter 232 has a purpose of supporting the base substrate 234, the base substrate 234 and the filter base 270 may be directly combined when the external light-shielding layer 230 is disposed on another surface of the filter base 270.

The base substrate 234 may include a compound such as terephthalate, acrylic, polycarbonate, urethane, acrylate, polyester, epoxy acrylate, and acrylate bromide. They are used in alone or in mixture thereof.

The light-shielding pattern 236 has a section having a wedge-shape, and is formed on the surface of the base substrate 234 corresponding to the panel assembly (not illustrated). Also, the light-shielding pattern 236 prevents the external light 320 from entering an inside of the panel assembly.

The light-shielding pattern 236 may include at least one material selected from the group consisting of metal, carbon, and a conductive polymeric material. Here, the conductive polymeric material includes at least one polymeric material selected from the group consisting of polythiophene, polypyrrole, polyaniline, poly(3,4-ethylenedioxythiophene), poly (3-alkylthiophene), polyisothianaphthene, poly(p-phenylenevinylene), poly(p-phenylene), and a derivative thereof. The polymeric material may include at least one material selected from the group consisting of a carbon nanotube, metal powder, and metal oxide powder.

The light-shielding pattern 236 included in the external light-shielding layer 230 absorbs the external light 320, prevents the external light 320 from entering the panel assembly, and totally reflects the incident light 310 from the panel assembly to the viewer. Accordingly, a high transmittance, with respect to visible light, and a high contrast ratio may be obtained.

It is desirable that the PDP apparatus has the high transmittance with respect to visible light, and the high contrast ratio. Here, the contrast ratio may be shown as Equation 1.

$$\text{contrast ratio} = \frac{\text{brightness of (white light + reflected light)}}{\text{brightness of (black light + reflected light)}} \quad \text{[Equation 1]}$$

When the light emitted from the panel assembly is allowed to pass through the PDP filter without filtration to increase the transmittance of the PDP apparatus, both the brightness of white light and the brightness of black light are increased. Therefore, when the brightness of the PDP apparatus is increased, the entire contrast ratio is relatively decreased.

The PDP filter 200 of the present invention uses the light-shielding pattern 236 absorbing light in order to increase the contrast ratio. Here, the light-shielding pattern 236 partially absorbs the incident light 310 emitted from the panel assembly, and reduces the brightness of white light and black light by a predetermined portion, thereby increasing the contrast ratio. Also, according to Equation 1, the contrast ratio corresponds to a function with respect to the brightness of reflected light, and reflected light includes light reflected after the external light 320 enters the panel assembly. Here, since the external light 320 is directly absorbed in the light-shielding pattern 236, or is indirectly absorbed in the light-shielding pattern 236, although reflection occurs in the panel assembly, the brightness of reflected light may be reduced. Accordingly, although identical reflected light with respect to white light and black light is generated, the brightness of reflected light in a denominator of Equation 1 is reduced. Therefore, the contrast ratio may be increased.

Also, the external light-shielding layer 230 complements the EM radiation-shielding effect. Specifically, the light-shielding pattern 236 included in the external light-shielding layer 230 includes the conductive polymeric material, and may have the EM radiation-shielding effect. As illustrated in FIG. 3, an EM radiation-shielding loop may be formed by generating an electrode pattern 238 disposed at both ends of the light-shielding pattern 236 being shaped as black stripes to be substantially perpendicular to the light-shielding pattern 236, thereby connecting the light-shielding pattern 236. Here, it is desirable that the electrode pattern 238 includes the conductive material. For example, the electrode pattern 238 may include the conductive polymeric material, similar to the light-shielding pattern 236. The EM radiation-shielding effect of the PDP filter 200 may be increased by the EM radiation-shielding loop.

Referring to FIG. 2 again, the filter base 270 includes the transparent substrate 210, the EM radiation-shielding layer 220 formed on the surface of the transparent substrate 210, and the color correction layer 240 and the antireflective layer 250 formed on the other surface of the transparent substrate 210. The present invention is not limited to the above stacking order, and the filter base 270 may have the multi-layered structure regardless of a stacking order of the transparent substrate 210, the EM radiation-shielding layer 220, the color correction layer 240, or the antireflective layer 250.

It is required to cover a display surface with a highly conductive material to have the EM radiation-shielding effect. A multi-layered transparent conductive film stacking a metal thin film and a transparent thin film having a high refractive index may be used for the EM radiation-shielding layer 220 to have the EM radiation-shielding effect according to the present exemplary embodiment.

Here, the transparent thin film having the high refractive index such as indium tin oxide (ITO), aluminum zinc oxide (AZO), and the like may be used for the multi-layered transparent conductive film in order to have the EM radiation-shielding effect. There are a multi-layered thin film alternately stacking the metal thin film such as gold, silver, copper, platinum, and palladium, and the transparent thin film having the high refractive index such as indium oxide, stannic oxide, zinc oxide, aluminum oxide, neodymium oxide, and niobium oxide, and the like as the multi-layered transparent conductive film. The metal thin film of the multi-layered transparent conductive film may have a high conductivity, and an NI radiation-shielding effect is great by a metal using reflection and absorption extending over a wide wavelength range. However, the transmittance with respect to visible light is relatively low. Also, a transparent thin film having the high refractive index of the multi-layered transparent conductive film has a relatively low conductivity or a relatively low reflection effect of NI radiation. However, a transparent thin film having the high refractive index of the multi-layered transparent conductive film has a great transparency. Therefore, the multi-layered transparent conductive film stacking the metal thin film and the transparent thin film having the high refractive index has a characteristic that the conductivity, the NI radiation-shielding effect, and the transmittance with respect to visible light are great by combining advantages of the metal thin film and the transparent thin film having the high refractive index.

Although the EM radiation-shielding layer 220 including the one to three multi-layered transparent conductive films being continuously stacked on each other is used in the present exemplary embodiment, a sufficient EM radiation-shielding effect may be obtained. Here, the one to three multi-layered transparent conductive films are formed by stacking the metal thin film and the transparent thin film having the high refractive index. The conventional EM radiation-shielding layer stacks the four to six metal thin films in order to increase the EM radiation-shielding effect, however, the present exemplary embodiment uses the external light-shielding layer 230 including the light-shielding pattern 236 of the conductive polymeric material. Therefore, although the EM radiation-shielding layer 220 including the one to three (more desirably, one to two) multi-layered transparent conductive films being continuously stacked on each other, is used, a sufficient EM radiation-shielding effect may be obtained. Here, the transparent thin film having the high refractive index may include at least one thin film including the above material, and the metal thin film may also include at least one thin film including the above material. Also, various thin films having the EM radiation-shielding effect may be added between the metal thin film and the transparent thin film having the high refractive index.

EM radiation is shielded by an effect of reflection and absorption of EM radiation by the EM radiation-shielding layer 220. In order to absorb EM radiation, a conductive metal thin film is required in the EM radiation-shielding layer 220. Also, it is required that the conductive metal thin film be thicker than a predetermined value in order to completely absorb EM radiation generated from the display apparatus. However, the thicker the conductive metal thin film is, the lower the transmittance with respect to visible light is. Also, the multi-layered transparent conductive film alternately stacking the metal thin film and the transparent thin film having the high refractive index may increase a reflective surface and reflection of EM radiation.

The metal thin film is a thin film layer including either silver or an alloy including silver. Since silver from among silver and the alloy including silver has high conductivity, high reflectivity with respect to infrared radiation, and high transmittance with respect to visible light when stacking multi-layers, it is desirable that silver is used. However, since silver has low chemical and physical stability, and is deteriorated by pollutants of a surrounding environment, vapor, heat, light, and the like, the alloy including silver and at least one other metal which is stable with respect to the surrounding environment, such as gold, platinum, palladium, copper, indium, tin, and the like, may be also used. Generally, since high conductivity and high optical characteristic of silver are deteriorated when adding silver to another metal, it is desirable that the metal thin film simply formed by silver is used for at least one layer from a plurality of metal thin films forming the multi-layered transparent conductive film. When all metal thin films are formed by silver and not an alloy, the EM radiation-shielding layer 220 having high conductivity and high optical characteristic may be obtained, however, the EM radiation-shielding layer 220 tends to be easily deteriorated by influences of the surrounding environment. This case of silver being deteriorated may be prevented by forming the transparent thin film having the high refractive index on the upper and lower sides of the metal thin film including silver. Any one of conventional well-known methods such as sputtering, ion plating, vacuum deposition, plating, and the like may be used for forming the metal thin film.

Also, the transparent thin film having the high refractive index has transparency with respect to visible light, and has an effect of preventing the visible light from being reflected by the metal thin film due to a refractive index difference from the metal thin film. Specific materials forming the transparent thin film having the high refractive index are an oxide such as indium, titanium, zirconium, bismuth, tin, zinc, antimony, tantalum, cerium, neodymium, lanthanum, thorium, magnesium, potassium, aluminum, niobium, and the like, combinations thereof, zinc sulfide, and the like. Although the oxide or a sulfide has a difference in stoichiometric formation with a metal, oxygen, and sulfur, it is irrelevant in a range by slightly modifying the optical characteristic. Since zinc oxide, a mixture of aluminum oxide and zinc oxide (AZO), indium oxide or a mixture of indium oxide and tin oxide (ITO) from among the oxide and the sulfide has high transparency, a high refractive index, a high growth rate of a film, and a characteristic of adhering closely to the metal thin film, it is desirable that zinc oxide, AZO, indium oxide or ITO is used. Also, absorptiveness of EM radiation, and conductivity of the EM radiation-shielding layer 220 may be increased using a thin film of an oxide semiconductor having a relatively high conductivity such as AZO and ITO. Any one of conventional well-known methods such as sputtering, ion plating, ion beam assist, vacuum deposition, wet coating, and the like may be used for forming the transparent thin film having the high refractive index.

There is an additional effect that the multi-layered transparent conductive film shields NI radiation, when the multi-layered transparent conductive film stacking the metal thin film and the transparent thin film having the high refractive index is used for the EM radiation-shielding layer 220 according to the present exemplary embodiment. Accordingly, two functions corresponding to an NI radiation-shielding function and the EM radiation-shielding function may be simply performed by the EM radiation-shielding layer 220 without separately forming the NI radiation-shielding layer. Although it is also not illustrated, the filter base 270 according to the present exemplary embodiment may separately include an NI radiation-shielding layer. The NI radiation-shielding layer is generated from the panel assembly, and shields the strong NI radiation causing electronic devices such as wireless phones, remote controls, and the like, to malfunction.

Hereinafter, a function of the external light-shielding layer used for the PDP filter according to the present invention is described in detail by experimental examples and comparative experimental examples. However, the following experimental examples are merely intended to illustrate the present invention, and the present invention is not limited to the following experimental examples. Also, since contents which are not illustrated here would be technically appreciated by those skilled in the art, a more specific description is omitted.

Experimental Example 1

Three transparent conductive films are formed on a surface of a transparent substrate by a direct current sputtering method by continuously stacking in an order of a niobium oxide ($Nb_2O_5$) film corresponding to a transparent thin film having a high refractive index, and a silver thin film corresponding to a metal thin film. Also, an EM radiation-shielding layer is formed by stacking the $Nb_2O_5$ film on a multi-layered structure of the transparent conductive films. Here, the $Nb_2O_5$ film is formed using an $Nb_2O_5$ target and argon gas as a sputtering gas. The silver thin film is formed using a silver target and argon gas as sputtering gas.

Next, an external light-shielding layer including a light-shielding pattern is formed on the EM radiation-shielding layer. Here, the light-shielding pattern has a wedge-shaped black stripe form, and includes the conductive polymeric material. Also, a PDP filter is made by forming a color correction layer and an NI radiation-shielding layer on another surface of the transparent substrate. An average transmittance of the PDP filter is controlled to be about 50% in a wavelength range corresponding to about 380 nm to about 780 nm of standard light source D65.

Experimental Example 2

Excluding the EM radiation-shielding layer, a PDP filter substantially similar to Experimental example 1 was prepared. In Experimental example 2, two multi-layered transparent conductive films being continuously stacked on each other are formed on the transparent substrate, and the EM radiation-shielding layer is formed stacking the $Nb_2O_5$ film on the multi-layered transparent conductive films.

Comparative Experimental Example 1

A PDP filter of Comparative experimental example 1 corresponds to the PDP filter, excluding the external light-shielding layer, from Experimental example 1.

Comparative Experimental Example 2

The PDP filter of Comparative experimental example 2 corresponds to the PDP filter, excluding the external light-shielding layer, from Experimental example 2.

Similar to the description above, an EM radiation-shielding amount and a reflection amount of external light with respect to the PDP filters obtained by Experimental examples 1 and 2, and Comparative experimental examples 1 and 2 are measured, similar to the following Table 1.

Here, the EM radiation-shielding amount corresponds to a difference of EM radiation values generated from the PDP apparatus in a state where the PDP filter is installed in the panel assembly and a state where the PDP filter is not installed in the panel assembly. The EM radiation values are measured according to Class B regulations in a shielded room satisfying American National Standards Institute (ANSI) C63.4-1992 corresponding to a measuring equipment standard for EM radiation.

Also, the reflection amount of external light corresponds to a brightness value of reflected light in which external light is reflected on the PDP filter in the state where the PDP filter is installed in the panel assembly. In this instance, artificially-formed external light has intensity of illumination corresponding to about 150 lux. Also, the brightness value of reflected light with respect to the PDP apparatus showing an entire black screen is measured in the wavelength range from about 380 nm to about 780 nm using a brightness measuring instrument.

TABLE 1

| | EM radiation-shielding amount (dBμV/m) | Reflection amount of external light (cd/m$^2$) |
|---|---|---|
| Experimental example 1 | 18 | 0.9 |
| Experimental example 2 | 15 | 0.9 |
| Comparative experimental example 1 | 15 | 2.2 |
| Comparative experimental example 2 | 12 | 3.0 |

Similar to description of Table 1, Experimental example 1 is examined comparing with Comparative experimental example 1, the EM radiation-shielding amount is increased, and the reflection amount of external light is decreased due to the external light-shielding layer. Similarly, Experimental example 2 is examined comparing with Comparative experimental example 2, the EM radiation-shielding amount is increased, and the reflection amount of external light is decreased due to the external light-shielding layer.

Examining Experimental example 2 and Comparative experimental example 1, the PDP filter of Experimental example 2 includes the EM radiation-shielding layer including two multi-layered transparent conductive films being continuously stacked on each other, and the external light-shielding layer. Conversely, the PDP filter of Comparative experimental example 1 includes the EM radiation-shielding layer including three multi-layered transparent conductive films being continuously stacked on each other, and excludes the external light-shielding layer. The EM radiation-shielding amount of the PDP filter of Experimental example 2 and Comparative experimental example 1 has the same value respectively corresponding to 15 dBμV/m. Generally, the thicker the multi-layered transparent conductive films are, the greater the EM radiation-shielding amount is, and the PDP filter of Experimental example 2 uses the multi-layered transparent conductive films which are relatively thin. However, it is obvious to those of ordinary skill in the art that the external light-shielding layer complements the EM radiation-shielding effect. Specifically, since the external light-shielding layer plays a role of the multi-layered transparent conductive films, the number of times of stacking the multi-layered transparent conductive films may be reduced using the external light-shielding layer. Therefore, production costs of the PDP filter may be reduced. Also, the reflection amount of external light may be reduced by the external light-shielding layer.

According to the exemplary embodiments of the preset invention, there is provided a display filter and a display apparatus including the display filter, which can increase a contrast ratio, increase brightness, and have an EM radiation-shielding effect of a display apparatus by forming, on the display filter, light-shielding patterns including a conductive polymeric material.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A display filter comprising:
    a filter base; and
    an external light-shielding layer formed on a surface of the filter base, wherein the external light-shielding layer comprises a base substrate including a transparent resin and light-shielding patterns spaced apart on a surface of the base substrate at predetermined intervals, and including a conductive material; and
    an electrode pattern disposed at both ends of the light-shielding patterns to be substantially perpendicular to the light-shielding pattern, thereby connecting the light-shielding patterns, wherein
    the filter base comprises an electromagnetic (EM) radiation-shielding layer including a multi-layered transparent conductive film formed by stacking a metal thin film and a transparent thin film having a high refractive index.

2. The display filter of claim 1, wherein the EM radiation-shielding layer comprises two or three multi-layered transparent conductive films being continuously stacked on each other.

3. The display filter of claim 2, wherein the EM radiation-shielding layer comprises a multi-layered structure where one to three multi-layered transparent conductive films are formed by continuously stacking a niobium oxide film and a silver thin film, and the niobium oxide film is formed on the multi-layered structure.

4. A display apparatus comprising:
    the display filter of any one of claims 1, 2 and 3.

5. A display filter comprising:
    a filter base comprising an electromagnetic (EM) radiation-shielding layer including a multi-layered transparent conductive film formed by stacking a metal thin film and a transparent thin film having a high refractive index;
    an external light-shielding layer formed on a surface of the filter base, wherein the external light-shielding layer comprises a base substrate including a transparent resin and light-shielding patterns spaced apart on a surface of the base substrate at predetermined intervals, and including a conductive material; and
    an electrode pattern disposed at both ends of the light-shielding patterns to be substantially perpendicular to the light-shielding pattern, thereby connecting the light-shielding patterns,
    wherein the light-shielding pattern comprises at least one material selected from the group consisting of metal, carbon, and a conductive polymeric material.

6. The display filter of claim 5, wherein the EM radiation-shielding layer comprises two or three multi-layered transparent conductive films continuously stacked on each other.

7. The display filter of claim 5, wherein the EM radiation-shielding layer comprises a multi-layered structure where one to three multi-layered transparent conductive films are formed by continuously stacking a niobium oxide film and a silver thin film, and the niobium oxide film is formed on the multi-layered structure.

8. A display apparatus comprising:
    the display filter of any one of claims 5 through 7.

9. The display filter of claim 1 or 5, wherein the electrode pattern is disposed only at the both ends of the light-shielding patterns to be substantially perpendicular to an extension direction of the light-shielding patterns.

* * * * *